(12) United States Patent
Lee et al.

(10) Patent No.: US 11,815,947 B2
(45) Date of Patent: Nov. 14, 2023

(54) FOLDABLE DISPLAY DEVICE

(71) Applicant: LG DISPLAY CO., LTD., Seoul (KR)

(72) Inventors: Jieun Lee, Busan (KR); NohJin Myung, Paju-si (KR); Eun Roh, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/542,586

(22) Filed: Dec. 6, 2021

(65) Prior Publication Data

US 2022/0206529 A1 Jun. 30, 2022

(30) Foreign Application Priority Data

Dec. 28, 2020 (KR) .................. 10-2020-0184415

(51) Int. Cl.
*G06F 1/16* (2006.01)
(52) U.S. Cl.
CPC .................. *G06F 1/1616* (2013.01)
(58) Field of Classification Search
None
See application file for complete search history.

(56) References Cited

U.S. PATENT DOCUMENTS

| | | | |
|---|---|---|---|
| 9,354,476 B2 * | 5/2016 | Han | G06F 1/1616 |
| 11,406,044 B2 * | 8/2022 | Wu | G09F 9/301 |
| 2014/0065326 A1 * | 3/2014 | Lee | G09F 9/301 |
| | | | 428/12 |
| 2015/0004334 A1 * | 1/2015 | Bae | B32B 38/0008 |
| | | | 156/298 |
| 2018/0092166 A1 * | 3/2018 | Kim | H05B 33/06 |
| 2018/0175310 A1 * | 6/2018 | Lee | H10K 50/844 |
| 2019/0265756 A1 * | 8/2019 | Jones | G09F 9/301 |

FOREIGN PATENT DOCUMENTS

KR 10-2020-0063801 A 6/2020

\* cited by examiner

*Primary Examiner* — Anthony Q Edwards
*Assistant Examiner* — Rashen E Morrison
(74) *Attorney, Agent, or Firm* — POLSINELLI PC

(57) ABSTRACT

A foldable display device includes a display panel including a folding area and a non-folding area, and a support substrate disposed under the display panel, the support substrate includes a first metal sheet including a plurality of wavy curved portions and a first planarization layer disposed on the first metal sheet, and the support substrate includes a second metal sheet disposed on the first planarization layer and having a planar surface shape and a second planarization layer disposed under the first metal sheet, therefore, since the support substrate integrated into a single layer is disposed under the display panel, folding properties of the display device may be improved, and an overall thickness of the display device may be decreased and a transfer of a pattern boundary or a folding area boundary can be minimized.

21 Claims, 8 Drawing Sheets

FOLDABLE DISPLAY DEVICE

CROSS-REFERENCE TO RELATED APPLICATION

This application claims the priority of Korean Patent Application No. 10-2020-0184415 filed on Dec. 28, 2020, which is hereby incorporated by reference in its entirety.

BACKGROUND

Field of the Disclosure

The present disclosure relates to a foldable display device, and more particularly, to a lightweight and thin foldable display device with improved folding properties.

Description of the Background

Recently, with the advancement of the information age, display devices for processing and displaying a large amount of information have been developed. Display devices used in monitors of computers, TVs, cell phones and the like may include organic light emitting display (OLED) devices that emits light by itself and liquid crystal display (LCD) devices requiring a separate light source.

Display devices have been widely used in the field of applications spanning from monitors of computers and TVs to personal portable equipment. Research on display devices having a large display area and a smaller volume and weight has been conducted.

Particularly, recently, a flexible display device has attracted attention as a next generation display device. The flexible display device is capable of displaying an image while the flexible display device is bent or folded like paper. The flexible display device uses a thin film transistor substrate made of plastic instead of glass. The flexible display device may be categorized into an unbreakable display device having a high durability, a bendable display device, a rollable display device, and a foldable display device. The flexible display device has advantages in use of space, interior decoration, and design, and may be applied in various fields.

In general, a foldable display device needs to be provided with a bottom plate that supports a display panel and includes a pattern capable of imparting folding properties. The foldable display device also needs to be provided with a top plate that maintains the curvature of a display panel during folding and suppresses the occurrence of creases on a top surface of the display panel.

If the top plate is a rigid body, folding properties may be degraded during folding. If the top plate is soft, dent properties may be degraded. Also, since the rigidity of a folded area is decreased due to the pattern of the bottom plate, the boundary is visible.

SUMMARY

Accordingly, the present disclosure is to provide a support substrate integrated into a single layer under a display panel.

In addition, present disclosure is to provide a display device in which a support substrate has a small thickness with improved folding properties.

The he present disclosure is also to provide a display device with an improved impact resistance.

Further, the present disclosure is to provide a display device with a minimized visibility of a folding area boundary from the outside.

The present disclosure is not limited to the above-mentioned features that are not mentioned above can be clearly understood by those skilled in the art from the following descriptions.

According to an aspect of the present disclosure, the foldable display device includes a display panel including a folding area and a non-folding area, and a support substrate disposed under the display panel. The support substrate includes a first metal sheet including a plurality of wavy curved portions and a first planarization layer disposed on the first metal sheet. The support substrate includes a second metal sheet disposed on the first planarization layer and having a planar surface shape and a second planarization layer disposed under the first metal sheet. Therefore, since the support substrate integrated into a single layer is disposed under the display panel, folding properties of the display device may be improved, and an overall thickness of the display device may be decreased. Also, a transfer of a pattern boundary or a folding area boundary may be minimized.

Other detailed matters of the exemplary aspects are included in the detailed description and the drawings.

According to the present disclosure, it is possible to implement a lightweight and thin foldable display device with a support substrate provided by integrating a back plate, a top plate, a bottom plate and a cushion into a single layer.

Also, according to the present disclosure, it is possible to provide the foldable display device with an improved impact resistance and improved folding properties due to a first metal sheet including wavy curved portions and a second metal sheet having a planar surface shape.

Further, according to the present disclosure, it is possible to implement the foldable display device with a minimized visibility of a pattern boundary or a folding area boundary from the outside by adjusting the lengths of furrows of the wavy curved portions of the first metal sheet.

Furthermore, according to the present disclosure, the support substrate includes the first metal sheet including the wavy curved portions instead of a pattern. Thus, a manufacturing process of the foldable display device may be simplified.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
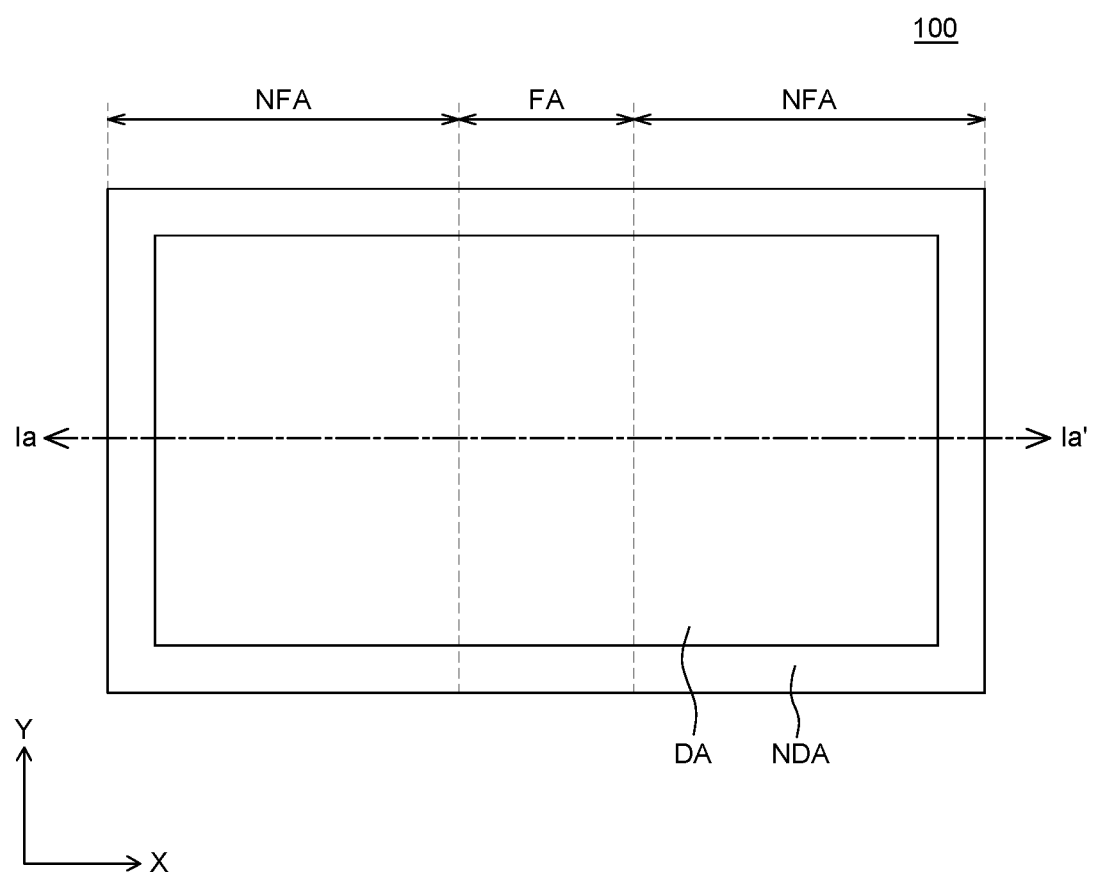
FIG. 1A is a schematic plan view of a foldable display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a foldable display device according to exemplary aspects of the present disclosure will be described in detail with reference to accompanying drawings.

FIG. 1A through FIG. 3 are diagrams for explain a foldable display device 100 according to an exemplary aspect of the present disclosure. Referring to FIG. 1A through FIG. 3, the foldable display device 100 according to an exemplary aspect of the present disclosure includes a display panel 120 and a support substrate 110.

Figure 1B:
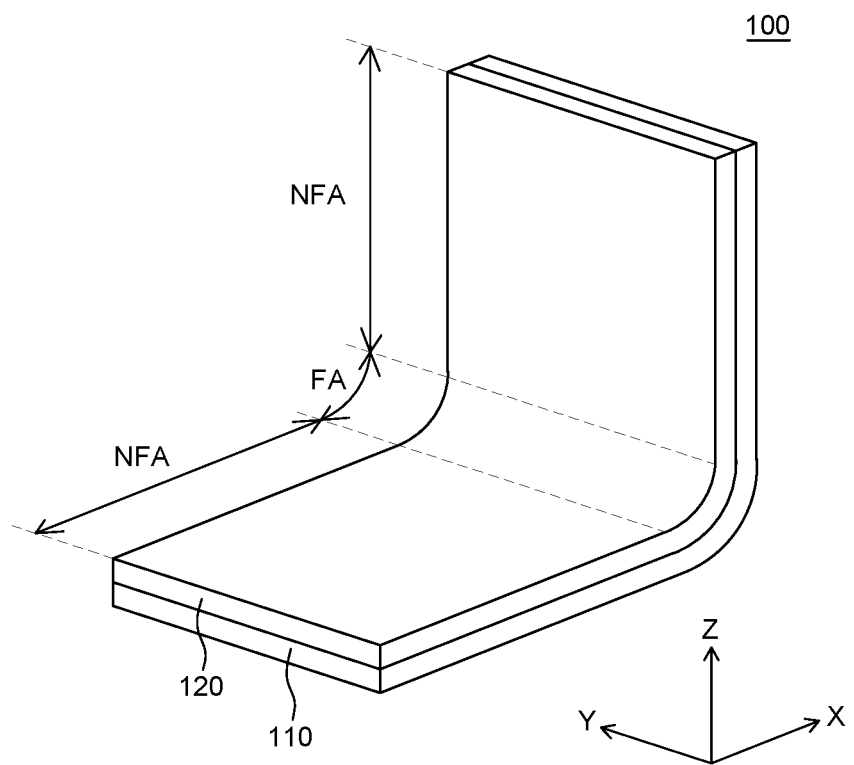
FIG. 1B is a perspective view schematically illustrating a state in which the foldable display shown in FIG. 1A is folded.

FIG. 1A is a schematic plan view of a foldable display device according to an exemplary aspect of the present disclosure. FIG. 1B is a perspective view schematically illustrating a state in which the foldable display device of FIG. 1A is folded.

Referring to FIG. 1A, the display panel 120 includes a display area DA and a non-display area NDA. The display area DA is an area where a plurality of pixels are disposed, and an image is displayed. The non-display area NDA surrounds the display area DA. The non-display area NDA is an area where an image is not displayed and various lines, driver ICs, printed circuit boards, and the like for driving the pixels and the driving circuits disposed in the display area DA are disposed. For example, various ICs, such as a gate driver IC and a data driver IC, VSS lines, and the like, may be disposed in the non-display area NDA.

Referring to FIG. 1A and FIG. 1B, the foldable display device 100 according to an exemplary aspect of the present disclosure includes at least one folding area FA and two or more non-folding areas NFA. The folding area FA is folded when the foldable display device 100 is folded and may be folded with a specific radius of curvature based on a folding axis. The non-folding areas NFA are not folded when the foldable display device 100 is folded. That is, the non-folding areas NFA remain flat even when the foldable display device 100 is folded. The non-folding areas NFA may be located at one side or both sides of the folding area FA. For example, if the folding axis of the folding area FA is formed in a Y-axis direction, the non-folding areas NFA are defined as areas extended from the folding area FA in an X-axis direction perpendicular to the folding axis.

In FIG. 1A and FIG. 1B, the foldable display device 100 includes the folding area FA and the non-folding areas NFA at both sides of the folding area FA. The numbers and locations of the folding area FA and the non-folding areas NFA may be variously changed, but are not limited thereto.

When the foldable display device 100 is folded, the folding area FA is folded based on a folding axis (Y-axis direction) and the folding area FA forms a part of a circle or an ellipse. Here, the radius of curvature of the folding area FA refers to the radius of a circle or an ellipse formed by the folding area FA. When the folding area FA is folded based on the folding axis (Y-axis direction), the non-folding areas NFA overlap each other. In the foldable display device 100, a top surface where an image is displayed is defined as a display surface and a bottom surface of the foldable display device 100 opposite to the display surface is defined as a rear surface. Herein, the folding area FA may be folded in an out-folding type in which the display surface of the foldable display device 100 is folded to be exposed to the outside. Alternatively, the folding area FA may be folded in an in-folding type in which the display surface of the foldable display device 100 is folded to face each other.

The display panel 120 is a panel for displaying an image. In the display panel 120, a display element which displays an image and a circuit unit which drives the display element may be disposed. For example, if the foldable display device 100 is an organic light emitting display device, the display element may include an organic light emitting diode. The following description will proceed under the assumption that a foldable display device according to various exemplary aspects of the present disclosure is a foldable organic light emitting display device including organic light emitting diodes. However, the present disclosure is not limited thereto.

The circuit unit may include various thin film transistors, capacitors, lines, and driver ICs for driving the organic light emitting diodes. For example, the circuit unit may include various components, such as a driving thin film transistor, a switching thin film transistor, a storage capacitor, a gate line, a data line, a gate driver IC and a data driver IC. However, the present disclosure is not limited thereto.

Specifically, the display panel 120 of the foldable display device 100 includes a very thin flexible substrate to achieve flexibility. The flexible substrate may be made of an insulating material having flexibility. For example, the flexible substrate may be a substrate made of insulating plastic selected from polyimide, polyethersulfone, polyethylene terephthalate and polycarbonate.

A support substrate 110 that supports the display panel 120 is disposed under the display panel 120. The support substrate 110 will be described in detail with reference to FIG. 2.

Figure 2:
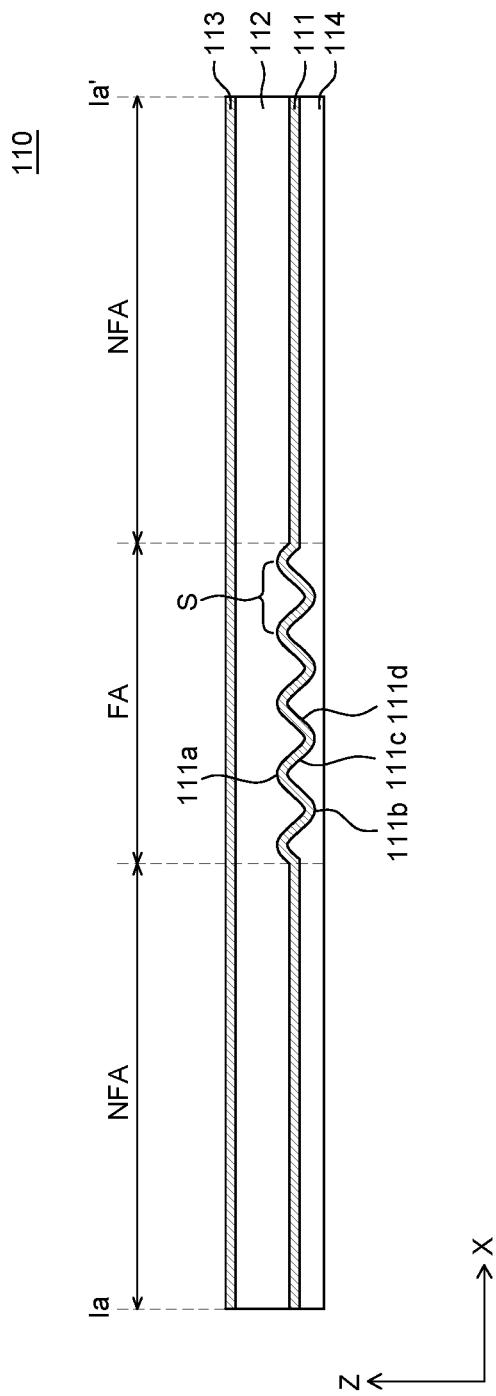
FIG. 2 is a cross-sectional view illustrating a support substrate of the foldable display device according to an exemplary aspect of the present disclosure.

FIG. 2 is a cross-sectional view illustrating a support substrate of the foldable display device according to an exemplary aspect of the present disclosure.

Referring to FIG. 2, the support substrate 110 is disposed under the display panel 120. The support substrate 110 includes a first metal sheet 111, a first planarization layer 112 disposed on the first metal sheet 111, a second metal sheet 113 disposed on the first planarization layer 112 and a second planarization layer 114 disposed under the first metal sheet 111. Here, the support substrate 110 may be a single layer formed by integrating a back plate, a top plate, a bottom plate and a cushion and disposed under the display panel.

A conventional support substrate may be typically made of a metal material such as stainless steel (SUS), SUS containing other metals such as nickel (Ni), invar, iron (Fe), aluminum (Al)-based or magnesium (Mg). However, the support substrate 110 of the foldable display device 100 according to an exemplary aspect of the present disclosure is not entirely made of a metal. The first metal sheet 111 and the second metal sheet 113 are included as a part of the support substrate 110. The support substrate 110 further includes the first planarization layer 112 and the second planarization layer 114 which are made of a non-metal.

The first metal sheet 111 may be made of a metal material such as stainless steel (SUS), SUS containing other metals such as nickel (Ni), invar, iron (Fe), aluminum (Al) or magnesium (Mg). For example, the first metal sheet 111 is entirely made of stainless steel (SUS) and thus may maintain a predetermined rigidity even if the support substrate 110 decreases in thickness. The first metal sheet 111 has a high modulus of 150 GPa to 250 GPa. Please be noted that in the context of the present disclosure, the term of "modulus" refers to "elastic modulus", unless expressly stated otherwise.

The first metal sheet 111 may include a plurality of wavy curved portions S. In general, opening patterns or semi-opening patterns are formed in the support substrate and adjustment, such as increasing an empty space between patterns, increasing the height of the patterns, or decreasing the thickness of the support substrate, is performed to improve folding properties. However, in this case, a separate transfer process for forming the patterns is needed, which makes a manufacturing process complicated. Also, the durability of the support substrate is decreased due to the patterns, which requires a compensation layer such as a top plate or the like. Thus, there is a limit in decreasing the thickness of the support substrate. Further, there are problems in that a pattern boundary is transferred and the boundary of a folding area is visible, and an impact resistance is decreased as the number of empty spaces formed by patterns is increased. To solve these problems, in the foldable display device 100 according to an exemplary aspect of the present disclosure, the first metal sheet 111 including the plurality of wavy curved portions S instead of opening patterns or semi-opening patterns is disposed in the folding area FA of the support substrate 110. Therefore, with the first metal sheet 111, folding properties may be secured and the durability and impact resistance may be improved. Also, the support substrate 110 may be manufactured to a small thickness.

Referring to FIG. 2, in the support substrate 110 of the display device 100 according to an exemplary aspect of the present disclosure, the wavy curved portions S may be formed in the folding area FA. Also, the first metal sheet 111 extended from the wavy curved portions S and having a planar surface shape may be disposed in the non-folding areas NFA.

The plurality of wavy curved portions S may be continuously disposed along a folding direction (X-axis direction). Each of the plurality of curved portions S may have a shape extended in a folding axis direction (Y-axis direction). The folding direction refers to a direction perpendicular to the folding axis direction. It should be noted that although according to the exemplary aspect of the present disclosure, the first metal sheet 111 includes a plurality of wavy curved portions S, the present disclosure is not limited thereto. In other words, generally speaking, each of the plurality of curved portions S may have a round shape, for example, a wavy shape, but is not limited thereto. The plurality of curved portions S includes top portions 111a most adjacent to the second metal sheet 113 and bottom end portions 111b most adjacent to a rear surface of the support substrate 110. Also, the plurality of curved portions S includes inclined portions 111c and 111d upwardly inclined from the bottom end portions 111b toward the top portions 111a. The inclined portions 111c and 111d include a first inclined portion 111c and a second inclined portion 111d different in direction from each other. A bottom end of the inclined portions 111c and 111d in any one of the plurality of curved portions S is in contact with a bottom end of the inclined portions 111c and 111d in another adjacent curved portion S. The plurality of curved portions S is continuously connected as described above unlike a general pattern, and makes it possible to minimize a transfer of a pattern boundary.

In the plurality of curved portions S, the length of each furrow refers to the distance between a top portion 111a and another adjacent top portion 111a. The height of each of the plurality of curved portions S refers to the distance between a top surface including a top portion 111a and another adjacent top portion 111a and a bottom surface including a bottom portion 111b and another adjacent bottom portion 111b. Although FIG. 2 illustrates that the heights of the plurality of curved portions S and the lengths of furrows in the folding area are uniform, they may be selectively adjusted as needed.

As the lengths of furrows of the plurality of curved portions S are decreased, folding properties may be improved. As the lengths of furrows are decreased, a maximum value of a stress is decreased during folding and stress concentration at any portion of the support substrate 110 is decreased during folding, which enables folding with a small curvature. Therefore, in the folding area FA, the lengths of furrows of the plurality of curved portions S may be in the range of 100 µm to 400 µm or from 200 µm to 400 µm. If the lengths of furrows are within this range, folding properties may be improved without a decrease in impact resistance.

The heights of the plurality of curved portions S may be in the range of 100 µm to 300 µm.

The first metal sheet 111 may have a uniform thickness and may be in the range of about 20 µm to about 40 µm. If the thickness is within this range, folding properties may be improved while maintaining an appropriate rigidity.

Referring to FIG. 2, the first planarization layer 112 is disposed on the first metal sheet 111 and the second planarization layer 114 is disposed under the first metal sheet 111. The first planarization layer 112 absorbs an impact of the first metal sheet 111 and disperses a stress during folding, and serves to bond the second metal sheet 113 to the first metal sheet 111. In the folding area, the second planarization layer 114 reduces a tensile stress of the support substrate 110 and makes the rear surface of the support substrate 110 flat.

The first planarization layer 112 and the second planarization layer 114 are made of a material having a lower modulus than the first metal sheet 111. For example, the first planarization layer 112 may be made of silicone gel (Si-gel), and the second planarization layer 114 may be made of silicone resin, but the present disclosure is not limited thereto.

Since the first planarization layer 112 absorbs an impact of the first metal sheet 111 during folding, an impact resistance of the first metal sheet 111 may be improved as a contact area with the first metal sheet 111 is increased.

In the folding area, a bottom surface of the first planarization layer 112 has the same surface as the surface of the plurality of curved portions in the first metal sheet 111. Here, the thickness of the first planarization layer 112 refers to the thickness of the thickest portion. As the thickness of the first planarization layer 112 is increased, the impact resistance may be improved. The thickness of the thickest portion may be in the range of 80 µm to 250 µm in which folding properties are not degraded.

Like the first planarization layer 112, the second planarization layer 114 absorbs a stress and an impact of the foldable display device and reduces a tensile stress during folding of the first metal sheet 111. During in-folding, i.e., when the display surface of the foldable display device 100 is folded to face each other, an outermost portion of the second planarization layer 114 is greatly deformed and thus has the greatest tensile stress. Therefore, the second planarization layer 114 having a lower modulus than the first metal sheet 111 is disposed to minimize a tensile stress.

Since a top surface of the second planarization layer 114 is in contact with the first metal sheet 111, the top surface of the second planarization layer 114 also has a curved surface shape including the plurality of curved portions S. Therefore, although the second planarization layer 114 is not uniform in thickness, the thickness may be in the range of about 50 µm to about 100 µm based on the thickness of the thickest portion.

Referring to FIG. 2, the second metal sheet 113 is disposed on the first planarization layer 112. The second metal sheet 113 is a sheet having a planar surface shape unlike the first metal sheet 111. Since the second metal sheet 113 is disposed on the first metal sheet 111, it may maintain the shape of the plurality of wavy curved portions S of the first metal sheet 111 and improve a restoring force during non-folding.

The second metal sheet 113 may be made of a metal material such as stainless steel (SUS), SUS containing other metals such as nickel (Ni), invar, iron (Fe), aluminum (Al) or magnesium (Mg). Although FIG. 2 illustrates that the second metal sheet 113 is made of the same material as the first metal sheet 111, it may be selectively changed as needed.

The second metal sheet 113 has a high modulus of 150 GPa to 250 GPa. This is to protect the first planarization layer 112, which has a low rigidity, between the first metal sheet 111 and the second metal sheet 113 and support the display panel 120 disposed on the second metal sheet 113.

The thickness of the second metal sheet 113 may be in the range of 20 µm to 40 µm. If the thickness is within this range, the shape retention ability and restoring force of the first metal sheet 111 may be improved without degradation in folding properties.

FIG. 3A through FIG. 3D are perspective views schematically illustrating a manufacturing method of the support substrate of the foldable display device shown in FIG. 2. For the convenience of description, only a manufacturing method of a portion of the support substrate in the folding area FA with omission of the other portions of the support substrate 110 in the non-folding areas NFA is illustrated.

Figure 3A:
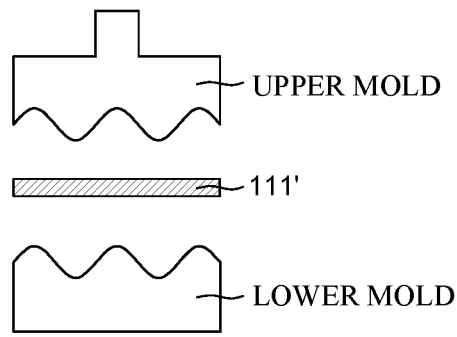
FIG. 3A through FIG. 3D are perspective views schematically illustrating a manufacturing method of the support substrate of the foldable display device according to an exemplary aspect of the present disclosure.

First, referring to FIG. 3A, the first metal sheet 111 is molded. A flat metal sheet 111' is molded into the first metal sheet 111 including a plurality of wavy curved portions having desired lengths of furrows by using a wavy press mold. For example, the metal sheet 111' may be made of SUS. The thickness of the metal sheet 111' may be in the range of about 20 µm to about 40 µm. The length of a furrow of each of the plurality of wavy curved portions may be in the range of about 250 µm to about 330 µm.

Figure 3B:
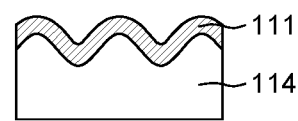

Then, referring to FIG. 3B, the second planarization layer 114 is formed under the molded first metal sheet 111. For example, a silicone resin may be coated and hardened under the first metal sheet 111 to form the second planarization layer 114. In this case, the thickness of the thickest portion of the second planarization layer 114 may be in the range of about 70 µm to about 80 µm, but is not limited thereto.

Figure 3C:
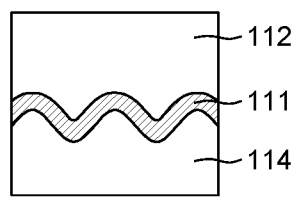

Thereafter, referring to FIG. 3C, the first planarization layer 112 is formed on the molded first metal sheet 111. For example, silicone gel may be coated and hardened on the first metal sheet 111 to form the first planarization layer 112. In this case, the thickness of the thickest portion of the first planarization layer 112 may be in the range of about 200 µm to about 250 µm, but is not limited thereto.

Figure 3D:
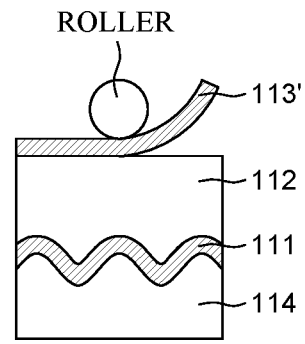

Then, referring to FIG. 3D, the second metal sheet 113 is disposed on the first planarization layer 112. For example, a metal sheet 113' is disposed on the first planarization layer 112 by using a roller. The second metal sheet 113 may be made of SUS that is the same material as the first metal sheet 111, and the roller is a laminated roller. The thickness of the second metal sheet 113 may be in the range of about 20 µm to about 40 µm, but is not limited thereto.

Although FIG. 3A through FIG. 3D illustrate the manufacturing method of the support substrate 110 shown in FIG. 2, the thicknesses of the first metal sheet 111, the second metal sheet 113, the first planarization layer 112 and the second planarization layer 114 may be adjusted as needed. Also, the material of the first planarization layer 112 and the second planarization layer 114 may be changed as needed. Further, the lengths of furrows of the plurality of curved portions in the first metal sheet 111 may be adjusted depending on the radius of curvature.

As shown in FIG. 3A through FIG. 3D, when the support substrate 110 of the foldable display device 100 according to an exemplary aspect of the present disclosure is manufactured, a separate optical adhesive is not needed. Without processes for separately manufacturing a back plate, a top plate, a bottom plate and a cushion layer, the support substrate 110 may be manufactured as a single layer including the above-described layers through a single process.

Accordingly, in the foldable display device 100 according to an exemplary aspect of the present disclosure, the support substrate 110 including the first metal sheet 111, the second metal sheet 113, the first planarization layer 112 disposed on the first metal sheet 111 and the second planarization layer 114 disposed under the first metal sheet 111 is disposed under the display panel 120. Thus, the support substrate 110 is formed as an integrated single layer without a top plate, a bottom plate and a back plate. Therefore, an overall thickness of the foldable display device may be decreased. Also, due to the first planarization layer 112 and the second planarization layer 114 which have a lower modulus than the first metal sheet 111 and the second metal sheet 113, an overall density of the support substrate 110 is lower than the density of the first metal sheet 111 and the second metal sheet 113. Therefore, the display device 100 may be lightweight. Meanwhile, a stress may be decreased during folding and a tensile stress may be minimized by the first metal sheet 111 including the wavy curved portions and the first planarization layer 112. Also, the second planarization layer 114 may absorb an external impact and thus may improve an impact resistance. Further, instead of a pattern, the curved portions are formed in the folding area, which suppresses a visibility of a pattern boundary from the outside. Furthermore, the support substrate 110 may be manufactured through a single process, and, thus, a manufacturing process of the foldable display device 100 may be simplified.

Figure 4A:
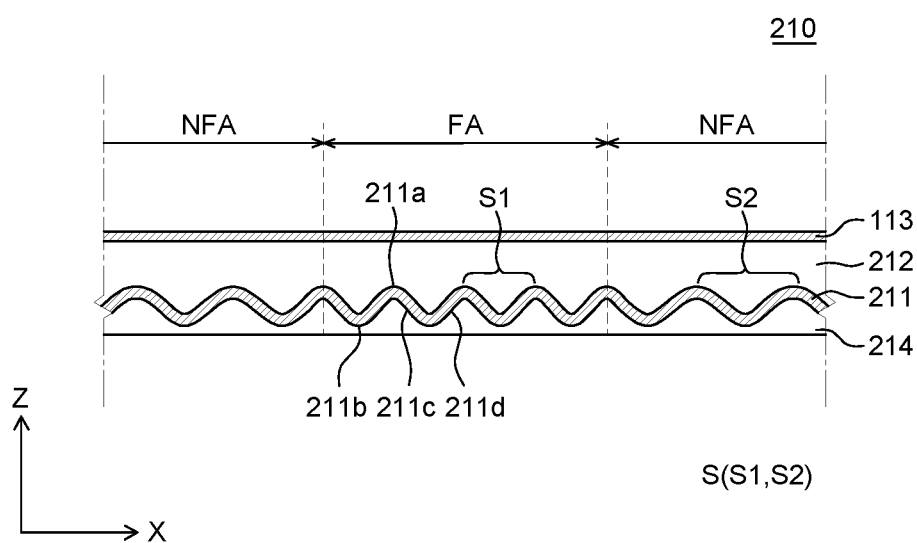
FIG. 4A is a cross-sectional view illustrating a support substrate of a foldable display device according to another exemplary aspect of the present disclosure.
Figure 4B:
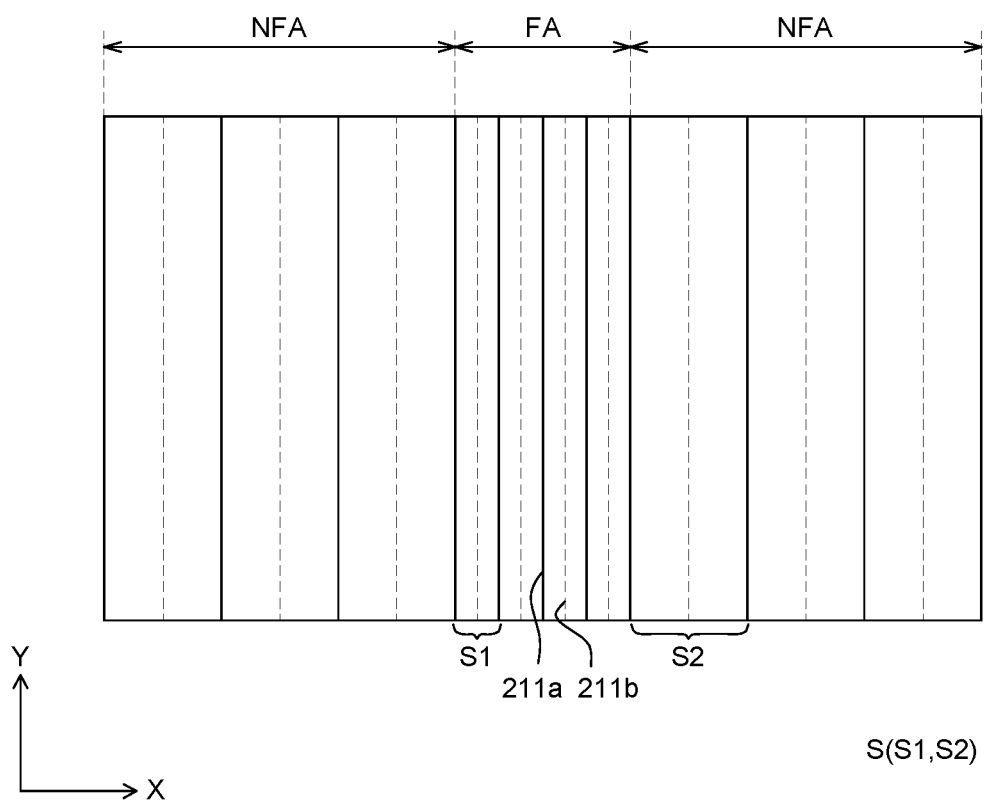
FIG. 4B is a schematic plan view illustrating the support substrate of FIG. 4A.
Figure 4C:
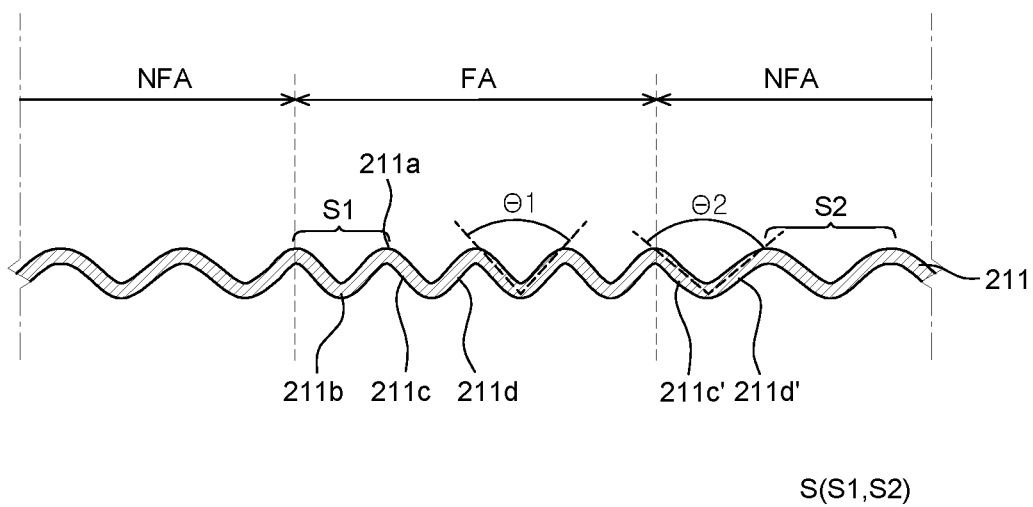
FIG. 4C is a cross-sectional view illustrating a part of the support substrate shown in FIG. 4A.

FIG. 4A through FIG. 4C are diagrams for explaining a foldable display device according to another exemplary aspect of the present disclosure. The foldable display device shown in FIG. 4A through FIG. 4C is substantially the same as the foldable display device 100 shown in FIG. 1A through FIG. 3D except the shapes of a first metal sheet 211, a first planarization layer 212 and a second planarization layer 214 in the non-folding areas NFA. Thus, repeated descriptions will be omitted.

FIG. 4A is a cross-sectional view illustrating a support substrate of the foldable display device according to another exemplary aspect of the present disclosure. FIG. 4B is a schematic plan view illustrating the support substrate of FIG. 4A. FIG. 4C is a cross-sectional view illustrating a part of the support substrate shown in FIG. 4A. FIG. 4B is a plan view of a top surface where the first metal sheet 211 is in contact with the first planarization layer 212 when viewed from the top. For the convenience of description, FIG. 4B and FIG. 4C omit the illustration of other components of a support substrate 210 except the first metal sheet 211.

Referring to FIG. 4A, in the support substrate 210 of the foldable display device according to another exemplary aspect of the present disclosure, the first metal sheet 211 including the plurality of wavy curved portions S is disposed in all of the folding area FA and the non-folding areas NFA. Therefore, with the first metal sheet 211, folding properties may be secured and the durability and impact resistance may be improved. Also, the support substrate 210 may be manufactured to a small thickness. Further, since the first metal sheet 211 includes the plurality of wavy curved portions S also disposed in the non-folding areas NFA, a change in properties between the folding area FA and the non-folding areas NFA may be minimized. Thus, it is possible to suppress a visibility of the boundary between the folding area FA and the non-folding areas NFA from the outside. Here, a plurality of curved portions in the folding area FA is referred to as a plurality of first curved portions S1, and a plurality of curved portions in the non-folding areas NFA is referred to as a plurality of second curved portions S2.

As shown in FIG. 4A, the heights of the plurality of curved portions and the lengths of furrows in the folding area FA and the non-folding areas NFA of the first metal sheet 211 are uniform respectively.

Referring to FIG. 4B, top portions 211a and bottom end portions 211b of the first metal sheet 211 have linear shapes extended in parallel to each other. In each of the plurality of curved portions S, the distance between one top portion 211a and another adjacent top portion 211a corresponds to the length of a furrow. Also, in the first metal sheet 211, the length of a furrow of each of the plurality of first curved portions S1 is smaller than the length of a furrow of each of the plurality of second curved portions S2. As the lengths of furrows of the plurality of curved portions S are decreased, folding properties may be improved. As the lengths of furrows are decreased, a maximum value of a stress is decreased and stress concentration at any portion of the support substrate 210 is decreased during folding, which enables folding with a small curvature. For example, in the folding area FA, the lengths of furrows of the plurality of first curved portions S1 may be in the range of 100 μm to 400 μm. Also, in the non-folding areas NFA, the lengths of furrows of the plurality of second curved portions S2 may be in the range of 400 μm to 500 μm. In the folding areas FA, if the lengths of furrows are within this range, folding properties of the folding area FA may be improved without a decrease in impact resistance. In the non-folding areas NFA, if the lengths of furrows are within this range, a stress at the boundary between the folding area FA and the non-folding areas NFA may be minimized during folding.

The heights of the plurality of curved portions S in the folding area FA and the non-folding areas NFA may be in the range of 100 μm to 300 μm.

Referring to FIG. 4C, the plurality of curved portions includes the top portions 211a most adjacent to the second metal sheet at a top surface of the first metal sheet 211 which is in contact with the first planarization layer. Also, the plurality of curved portions includes the bottom end portions 211b most adjacent to a rear surface of the support substrate at a bottom surface of the first metal sheet 211 which is in contact with the second planarization layer. Further, the plurality of curved portions includes inclined portions upwardly inclined from the bottom end portions 211b toward the top portions 211a. Here, the inclined portions include first inclined portions 211c and second inclined portions 211d. Here, A first inclined portion 211c and a second inclined portion 211d are connected at one top portion 211a of the plurality of first curved portions S1 and proceed in different directions from each other. The first inclined portion 211c' and the second inclined portion 211d' are connected at one top portion 211a of the plurality of second curved portions S2 and proceed in different directions from each other. An angle θ1 between the first inclined portion 211c and the second inclined portion 211d is smaller than an angle θ2 between a first inclined portion 211c' and a second inclined portion 211d'. This means that each of the first curved portions S1 has a greater curvature than each of the second curved portions S2. As the curvature of a curved portion S is increased, folding properties may be improved and a stress may be minimized during folding.

The shapes of the first planarization layer 212 and the second planarization layer 214 may be determined by the second curved portions S2 of the first metal sheet 211 in the non-folding areas NFA.

Accordingly, in the foldable display device according to another exemplary aspect of the present disclosure, the support substrate 210 including the first metal sheet 211 with the plurality of curved portions S having different lengths of furrows is disposed in the folding area FA and the non-folding areas NFA. Thus, it is possible to minimize a visibility of the boundary between the folding area FA and the non-folding areas NFA from the outside. Also, it is possible to provide a lightweight and thin foldable display device. Therefore, a stress may be decreased during folding and a tensile stress may be minimized by the first metal sheet 211 including the wavy curved portions S and the first planarization layer 212. Also, the second planarization layer 214 may absorb an external impact and thus may improve an impact resistance of the foldable display device. Particularly, instead of a pattern, the curved portions S are formed in the folding area FA, which minimizes a visibility of a pattern boundary and a folding area boundary from the outside. Further, the support substrate 210 may be manufactured through a single process, and, thus, a manufacturing process of the foldable display device may be simplified.

Figure 5:
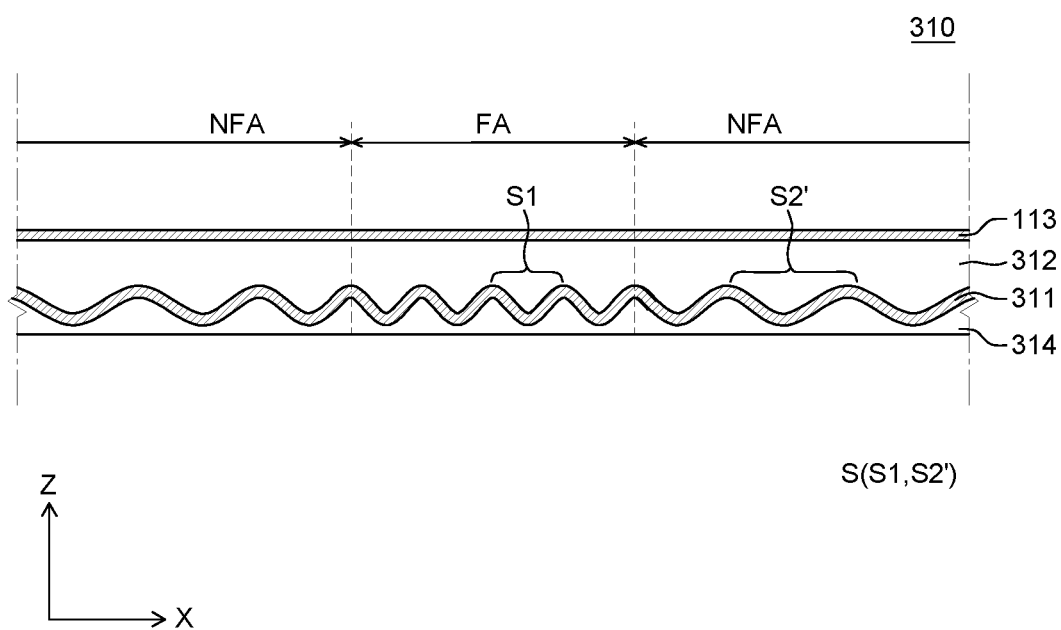
FIG. 5 is a cross-sectional view illustrating a support substrate of a foldable display device according to yet another exemplary aspect of the present disclosure.

FIG. 5 is a cross-sectional view illustrating a support substrate of a foldable display device according to yet another exemplary aspect of the present disclosure. The foldable display device shown in FIG. 5 is substantially the same as the foldable display device shown in FIG. 4A through FIG. 4C except a first metal sheet 311, a first planarization layer 312 and a second planarization layer 314 in the non-folding areas NFA. Thus, repeated descriptions will be omitted. The first metal sheet 311 disposed in a support substrate 310 of the foldable display device according to yet another exemplary aspect of the present disclosure includes the plurality of wavy curved portions S in the folding area FA and the non-folding areas NFA. The plurality of curved portions S includes first curved portions S1 and second curved portions S2' corresponding to the folding area FA and the non-folding areas NFA, respectively.

The lengths of furrows of the first curved portions S1 in the first metal sheet 311 are smaller than the lengths of furrows of the second curved portions S2'. Also, the lengths of furrows of the second curved portions S2' may be increased as the distance from the folding area FA is increased. Therefore, a rapid change in properties at the boundary between the non-folding areas NFA and the folding area FA may be suppressed. Thus, it is possible to minimize a visibility of the boundary of the folding area FA from the outside.

The shapes of the first planarization layer 312 and the second planarization layer 314 may be determined by the second curved portions S2' of the first metal sheet 311 in the non-folding areas NFA.

Thus, the support substrate 310 of the foldable display device according to yet another exemplary aspect of the present disclosure is disposed so that the lengths of furrows of the second curved portions S2' are gradually increased in the non-folding areas NFA. Thus, it is possible to minimize a visibility of the boundary between the folding area FA and the non-folding areas NFA from the outside. Also, it is possible to provide a lightweight and thin foldable display device. Therefore, a stress may be decreased during folding and a tensile stress may be minimized by the first metal sheet 311 including the wavy curved portions S and the first planarization layer 312. Particularly, the second planarization layer 314 may absorb an external impact and thus may improve an impact resistance of the foldable display device.

Hereinafter, the effects of the present disclosure will be described in more detail with reference to Aspects, Reference Aspects and Comparative Aspects. However, the following Aspects are provided for the purpose of illustration, but do not limit the scope of the present disclosure.

Comparative Example

A folding simulation with a radius of curvature of the uppermost surface based on the symmetry axis of 1.5 mm was performed on a support substrate having a structure in which a 50 μm back plate having a modulus of about 3143 MPa, a 25 μm adhesive layer, a 30 μm top plate having a modulus of about 193000 MPa, a 25 μm adhesive layer and a 150 μm bottom plate having a modulus of about 167000 MPa are sequentially laminated. According to a result of the simulation, a maximum value of a stress was about 7.3 GPa.

Aspect 1 and Aspect 2

Support substrates were manufactured as shown in FIG. 2. Specifically, each support substrate includes a first metal sheet made of stainless steel with a thickness of 30 μm and a second metal sheet made of stainless steel with a thickness of 30 μm. Also, the support substrate includes a first planarization layer made of silicone gel including the thinnest portion with a thickness of 19 μm and the thickest portion with a thickness of 89 μm and a second planarization layer made of silicone resin including the thinnest portion with a thickness of 1 μm and the thickest portion with a thickness of 71 μm.

Each of Aspect 1 and Aspect 2 includes a first metal sheet including a plurality of wavy curved portions. The lengths of furrows in Aspect 1 and Aspect 2 are 400 μm and 150 μm, respectively. A folding simulation with a radius of curvature of the uppermost surface based on the symmetry axis of 1.5 mm was performed on each of the support substrates of Aspect 1 and Aspect 2, and a result thereof was as shown in the following Table 1.

TABLE 1

|  | Aspect 1 | Aspect 2 |
| --- | --- | --- |
| Length of furrow | 400 μm | 150 μm |
| Maximum stress | 1.89 GPa | 1.69 GPa |

It may be seen by comparison between the result shown in Table 1 and a maximum stress of 7.3 GPa of Comparative Aspect that each of Aspect 1 and Aspect 2 showed a very low stress. Therefore, it was confirmed that a folding stress may be minimized by a plurality of curved portions disposed in a folding area. Also, a stress of Aspect 2 with relatively smaller lengths of furrows is lower than a stress of Aspect 1. Thus, it may be seen that folding properties may be improved as the lengths of furrows are decreased.

Aspect 3 and Aspect 4

Support substrates were manufactured to have the same configuration as those of Aspect 1 and Aspect 2 except the thickness of a first planarization layer and the lengths of furrows of curved portions. The lengths of furrows of a plurality of curved portions of Aspect 3 and Aspect 4 were set to 300 μm. According to a result of a folding simulation with a radius of curvature of the uppermost surface based on the symmetry axis of 1.5 mm, changes in maximum stress depending on the thickness of the first planarization layer were as shown in the following Table 2.

TABLE 2

|  | Aspect 3 | Aspect 4 |
| --- | --- | --- |
| Thickness of first planarization layer | 19 μm to 89 μm | 139 μm ~209 μm |
| Maximum stress | 2.03 GPa | 1.89 GPa |

Referring to Table 2, it may be seen that a maximum stress is decreased during folding as the thickness of the first planarization layer is increased. This is because an impact applied to the first metal sheet during folding is absorbed by the first planarization layer having a lower modulus than the first metal sheet, and, thus, a stress is decreased. That is, an impact resistance may be improved as the thickness of the first planarization is increased in a range in which folding properties are not degraded.

The exemplary aspects of the present disclosure can also be described as follows:

According to an aspect of the present disclosure, there is provided a foldable display device. The foldable display device includes a display panel including a folding area and a non-folding area. The foldable display device further includes a support substrate disposed under the display panel. The support substrate includes a first metal sheet including a plurality of wavy curved portions, a first planarization layer disposed on the first metal sheet, a second metal sheet disposed on the first planarization layer and having a planar surface shape, and a second planarization layer disposed under the first metal sheet.

The plurality of curved portions may be continuously disposed along a folding direction. Each of the plurality of curved portions may have a shape extended in a direction perpendicular to the folding direction.

Each of the plurality of curved portions may include a bottom end portion, an inclined portion upwardly inclined from the bottom end portion, and a top portion at a top end of the inclined portion. A distance between a top portion of one of the plurality of curved portions and a top portion of another curved portion adjacent thereto may be from 100 μm to 500 μm.

The plurality of curved portions may include a plurality of first curved portions corresponding to the folding area and a plurality of second curved portions corresponding to the non-folding area.

A distance between a top portion of one of the plurality of second curved portions and a top portion of another second curved portion adjacent thereto may be greater than a distance between a top portion of one of the plurality of first curved portions and a top portion of another first curved portion adjacent thereto.

In the plurality of second curved portions, a distance between a top portion of one of the plurality of second curved portions and a top portion of another second curved portion adjacent thereto may be gradually increased as a distance from the folding area may be increased.

Each of the plurality of curved portions may include a bottom end portion, an inclined portion upwardly inclined from the bottom end portion, and a top portion at a top end of the inclined portion. The inclined portion may include a first inclined portion and a second inclined portion proceed in different directions from each other. An angle between the first inclined portion and the second inclined portion included in one of the plurality of first curved portions may be smaller than an angle between the first inclined portion and the second inclined portion included in one of the plurality of second curved portions.

Each of the plurality of curved portions may have a round shape.

The first metal sheet may be made of a metal or an alloy having a modulus of 150 GPa to 250 GPa.

The first planarization layer and the second planarization layer may have a lower modulus than the first metal sheet.

The second planarization layer may be made of at least one selected from the group consisting of silicone resins.

The first planarization layer may be made of silicone gel (Si-gel).

The first metal sheet may be made of the same material as the second metal sheet.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device, comprising:
   a display panel including a folding area and a non-folding area; and
   a support substrate disposed under the display panel,
   wherein the support substrate includes:
      a first metal sheet including a plurality of wavy curved portions;
      a first planarization layer disposed on the first metal sheet;
      a second metal sheet disposed on the first planarization layer and having a planar surface shape; and
      a second planarization layer disposed under the first metal sheet,
   wherein the plurality of wavy curved portions have a continuous wavy curved shape in a cross-sectional view perpendicular to a display surface of the foldable display device,
   the first planarization layer is disposed between the second metal sheet having the planar surface shape and the first metal sheet including the plurality of wavy curved portions,
   the first planarization layer has various thicknesses at the folding area, and
   an upper surface of the second planarization layer has a wavy curved shape at the folding area.

2. The foldable display device according to claim 1, wherein the plurality of wavy curved portions is continuously disposed along a folding direction, and each of the plurality of wavy curved portions has a shape extended in a direction perpendicular to the folding direction.

3. The foldable display device according to claim 1, wherein each of the plurality of wavy curved portions includes a bottom end portion, an inclined portion upwardly inclined from the bottom end portion, and a top portion at a top end of the inclined portion, and
wherein a distance between a top portion of one of the plurality of wavy curved portions and a top portion of another curved portion adjacent thereto is in a range of between 100 µm and 500 µm.

4. The foldable display device according to claim 1, wherein the plurality of wavy curved portions includes a plurality of first curved portions corresponding to the folding area and a plurality of second curved portions corresponding to the non-folding area.

5. The foldable display device according to claim 4, wherein a distance between a top portion of one of the plurality of second curved portions and a top portion of another second curved portion adjacent thereto is greater than a distance between a top portion of one of the plurality of first curved portions and a top portion of another first curved portion adjacent thereto.

6. The foldable display device according to claim 4, wherein in the plurality of second curved portions, a distance between a top portion of one of the plurality of second curved portions and a top portion of another second curved portion adjacent thereto is gradually increased as a distance from the folding area is increased.

7. The foldable display device according to claim 4, wherein each of the plurality of wavy curved portions includes a bottom end portion, an inclined portion upwardly inclined from the bottom end portion, and a top portion at a top end of the inclined portion,
wherein the inclined portion includes a first inclined portion and a second inclined portion proceed in different directions from each other, and
wherein an angle between the first inclined portion and the second inclined portion included in one of the plurality of first curved portions is smaller than an angle between a first inclined portion and a second inclined portion included in one of the plurality of second curved portions.

8. The foldable display device according to claim 1, wherein each of the plurality of wavy curved portions has a round shape.

9. The foldable display device according to claim 1, wherein the first metal sheet is made of a metal or an alloy having a modulus of 150 GPa to 250 GPa.

10. The foldable display device according to claim 1, wherein the first planarization layer and the second planarization layer have a lower modulus than the first metal sheet.

11. The foldable display device according to claim 1, wherein the second planarization layer is made of silicone resin.

12. The foldable display device according to claim 1, wherein the first planarization layer is made of silicone gel (Si-gel).

13. The foldable display device according to claim 1, wherein the first metal sheet is made of a same material as the second metal sheet.

14. The foldable display device according to claim 1, wherein a pitch of a first wavy curved portion that is adjacent to the non-folding area is greater than a pitch of a second wavy curved portion that is closer to a center of the folding area.

15. A foldable display device having a folding area and a non-folding area, comprising:
a first planarization layer;
a first metal sheet including a plurality of wavy curved portions at the folding area;
a second planarization layer disposed on the first metal sheet;
a second metal sheet having a planar surface shape; and
a display panel disposed on the second metal sheet,
wherein the plurality of wavy curved portions have a continuous wavy curved shape in a cross-section view perpendicular to a display surface of the foldable display device,
the first planarization layer is disposed between the second metal sheet having the planar surface shape and the first metal sheet including the plurality of wavy curved portions,
the first planarization layer has various thicknesses at the folding area, and
and upper surface of the second planarization layer has a wavy curved shape at the folding area.

16. The foldable display device according to claim 15, wherein the plurality of wavy curved portions is continuously disposed along a folding direction, and each of the plurality of wavy curved portions has a shape extended in a direction perpendicular to the folding direction.

17. The foldable display device according to claim 15, wherein each of the plurality of wavy curved portions includes a bottom end portion, an inclined portion upwardly inclined from the bottom end portion, and a top portion at a top end of the inclined portion, and
wherein a distance between a top portion of one of the plurality of curved portions and a top portion of another curved portion adjacent thereto is in a range of between 100 µm and 500 µm.

18. The foldable display device according to claim 15, wherein the plurality of wavy curved portions includes a plurality of first curved portions corresponding to the folding area and a plurality of second curved portions corresponding to the non-folding area.

19. The foldable display device according to claim 18, wherein a distance between a top portion of one of the plurality of second curved portions and a top portion of another second curved portion adjacent thereto is greater than a distance between a top portion of one of the plurality of first curved portions and a top portion of another first curved portion adjacent thereto.

20. The foldable display device according to claim 18, wherein in the plurality of second curved portions, a distance between a top portion of one of the plurality of second curved portions and a top portion of another second curved portion adjacent thereto is gradually increased as a distance from the folding area is increased.

21. The foldable display device according to claim 18, wherein each of the plurality of a wavy curved portions includes a bottom end portion, an inclined portion upwardly inclined from the bottom end portion, and a top portion at a top end of the inclined portion,
wherein the inclined portion includes a first inclined portion and a second inclined portion proceed in different directions from each other, and
wherein an angle between the first inclined portion and the second inclined portion included in one of the plurality of first curved portions is smaller than an angle between a first inclined portion and a second inclined portion included in one of the plurality of second curved portions.

* * * * *